US009538684B2

(12) United States Patent
Chen et al.

(10) Patent No.: US 9,538,684 B2
(45) Date of Patent: Jan. 3, 2017

(54) SERVER DEVICE

(71) Applicant: Quanta Computer Inc., Taoyuan Shien (TW)

(72) Inventors: Chao-Jung Chen, New Taipei (TW); Ta-Chih Chen, New Taipei (TW); Yaw-Tzorng Tsorng, Taipei (TW)

(73) Assignee: Quanta Computer, Inc., Taoyuan (TW)

( * ) Notice: Subject to any disclaimer, the term of this patent is extended or adjusted under 35 U.S.C. 154(b) by 0 days.

(21) Appl. No.: 14/324,633

(22) Filed: Jul. 7, 2014

(65) Prior Publication Data

US 2015/0208543 A1    Jul. 23, 2015

(30) Foreign Application Priority Data

Jan. 22, 2014  (TW) .............................. 103102323 A

(51) Int. Cl.
| H05K 7/16 | (2006.01) |
| H05K 7/14 | (2006.01) |
| G06F 1/18 | (2006.01) |

(52) U.S. Cl.
CPC ............. *H05K 7/1489* (2013.01); *G06F 1/184* (2013.01); *G06F 1/187* (2013.01); *H05K 7/1487* (2013.01)

(58) Field of Classification Search
CPC ...... H05K 7/1489; H05K 7/1491; H05K 5/00; H05K 7/1474; H05K 7/1448; H05K 7/20563; H05K 7/20581; H05K 7/1487; G06F 1/16; G06F 1/1658; G06F 1/181–1/187; G06F 1/1656; G11B 33/126; G11B 33/128

USPC ......... 361/679.33–679.39, 679.49, 724–727, 361/824–827, 694, 784–786, 788, 792, 361/796, 679.31–679.39; 312/223.1, 312/223.2, 249.4, 249.1, 334.1, 334.7
See application file for complete search history.

(56) References Cited

U.S. PATENT DOCUMENTS

| 7,639,486 | B2* | 12/2009 | Champion et al. ...... 361/679.32 |
| 2003/0039099 | A1* | 2/2003 | Chen ....................... G06F 1/181 361/727 |
| 2003/0112596 | A1* | 6/2003 | Shih ............................. 361/685 |
| 2010/0027213 | A1* | 2/2010 | Wu ......................... G06F 1/184 361/679.39 |
| 2010/0265645 | A1* | 10/2010 | Wang et al. ................ 361/679.4 |

(Continued)

FOREIGN PATENT DOCUMENTS

| JP | 3075649 U | 2/2001 |
| TW | M 372609 U | 1/2010 |

(Continued)

OTHER PUBLICATIONS

Office Action mailed Oct. 28, 2014; in a corresponding Japanese patent application.

(Continued)

*Primary Examiner* — Courtney Smith
*Assistant Examiner* — Sagar Shrestha
(74) *Attorney, Agent, or Firm* — Nixon & Peabody LLP

(57) ABSTRACT

A server device includes a server rack and at least one server unit having a first sliding tray, a second sliding tray, a storage array module and a motherboard module. The server rack includes a first opening and a second opening which are opposite with each other. The first sliding tray is slidably disposed in the server rack. The second sliding tray is slidably disposed in the first sliding tray. The storage array module is disposed on the second sliding tray. The motherboard module is disposed on the first sliding tray and electrically connected to the storage array module.

7 Claims, 4 Drawing Sheets

(56) References Cited

U.S. PATENT DOCUMENTS

| | | | |
|---|---|---|---|
| 2011/0043994 A1 | 2/2011 | Cheng et al. | |
| 2011/0310550 A1* | 12/2011 | Xu | G06F 1/20 361/679.33 |
| 2012/0051010 A1* | 3/2012 | Chen | 361/752 |
| 2012/0293947 A1* | 11/2012 | Chen et al. | 361/679.33 |
| 2013/0342990 A1* | 12/2013 | Jau et al. | 361/679.39 |
| 2014/0204525 A1* | 7/2014 | Pecone et al. | 361/679.33 |
| 2014/0204537 A1* | 7/2014 | Rust | 361/727 |
| 2014/0340837 A1* | 11/2014 | Jau et al. | 361/679.33 |
| 2015/0043146 A1* | 2/2015 | Li | H05K 7/1487 361/679.31 |

FOREIGN PATENT DOCUMENTS

| | | | |
|---|---|---|---|
| TW | 201202898 A | 1/2012 | |
| TW | 201223049 A | 6/2012 | |
| TW | 201228556 A | 7/2012 | |
| TW | M 464726 U | 11/2013 | |

OTHER PUBLICATIONS

Office Action mailed Nov. 3, 2014; in a corresponding Taiwanese patent application.
English language abstract for JP U 3075649; published Feb. 27, 2001.
English language abstract for TW 201202898; published Jan. 16, 2012.
English language abstract for TW 201223049; published Jun. 1, 2012.
English language abstract for TW M464726; published Nov. 1, 2013.
English language abstract for TW 201228556; published Jul. 1, 2012.
English language abstract for TW M372609; published Jan. 11, 2010.
Office Action mailed on Jul. 21, 2015 in Japanese Application No. 2014-080343.
Summary of Office Action mailed on Jul. 21, 2015 in Japanese Application No. 2014-080343.

* cited by examiner

SERVER DEVICE

RELATED APPLICATIONS

This application claims priority to Taiwan application no. 103102323, filed Jan. 22, 2014, the entirety of which is incorporated herein by reference.

BACKGROUND

Technical Field

The present disclosure relates to a server device. More particularly, the present disclosure relates to a server device with storage array modules.

Description of Related Art

Currently, when a server device is maintained or replaced with components, a supervisor has to move backwards to a rear end of the server device, or even has to dismantle the server device for unplugging signal wires from the rear end of the server device first, so that the components can be taken out from the server device. In the current server industries, even though a server rack of the server device is generally received with plural server units which may be pulled out from the front end of the server rack, so that a supervisor can pull out anyone of the server units from the server rack, and maintain or replace the components of the server unit being pulled out.

However, because the server device is getting enormous in scale, when maintaining or replacing all or a part of components installed in one of the server units, the supervisor has to pull out the server unit entirely from the server rack before maintaining or replacing the components of the server unit, so as to waste unnecessary labor and time, and also exist inconvenience of the maintenance process of the server device.

SUMMARY

One aspect of this disclosure is to provide a server device which is allowed to partially maintain and replace a particular component therein, for overcoming the above-mentioned disadvantages existing in the prior art.

According to one embodiment of this disclosure, a server device includes a server rack and at least one server unit having a first sliding tray, a second sliding tray, at least one storage array module and a motherboard module. The server rack includes an accommodation space, a first opening and a second opening in which the first opening and the second opening are located at two opposite ends of the server rack, and the accommodation space is in communication with the first opening and the second opening. The first sliding tray is slidably disposed in the accommodation space, and pushed into or pulled outwards from the accommodation space via the first opening, and the first sliding tray is provided with a receiving space thereon. The second sliding tray is slidably disposed in the receiving space, and pushed into or pulled outwards from the first sliding tray via the first opening. The storage array module is fixedly disposed on the second sliding tray. The motherboard module is disposed on the first sliding tray, and electrically connected to the storage array module.

Therefore, when the storage array module is needed to be maintained or replaced by a supervisor, the supervisor only needs to pull the second sliding tray out of the server device from the first sliding tray for maintaining or replacing the storage array module in the second sliding tray. The supervisor does not have to entirely pull out the server unit by pulling the first sliding tray. Therefore, processing labor and time can be saved, and the convenience of the maintenance process of the server device also can be enhanced.

In one or more embodiments of this disclosure, the server unit includes a plurality of input/output interface elements. The input/output interface elements are disposed on the motherboard module, and electrically connected to the motherboard module. All of the input/output interface elements are only exposed outwards from the first opening, and are not exposed outwards from the second opening. Thus, since the storage array module can be pulled outwards from the server rack along with the second sliding tray via the first opening, and all of the input/output interface elements are only exposed outwards from the first opening, the conveniences for operating the server unit, changing components thereof, drawing objects thereof and removing wire thereof in front of the server rack can be enhanced, so as to save the wasted labor and time.

In one or more embodiments of this disclosure, the server unit includes at least one power-supply module. The power-supply module is pluggably disposed in the receiving space, and electrically connected to the motherboard module and the storage array module.

In one or more embodiments of this disclosure, the receiving space is divided into an upper region and a lower region which are stacked with each other, and the first sliding tray is provided with a splitting plate thereon, the splitting plate stands on the first sliding tray and divides the upper region and the lower region of the receiving space into a plurality of containing spaces.

In one or more embodiments of this disclosure, the second sliding tray is slidably disposed in one of the containing spaces of the upper region of the receiving space.

In one or more embodiments of this disclosure, the power-supply module is disposed in one of the containing spaces of the lower region of the receiving space.

In one or more embodiments of this disclosure, the power-supply module is disposed in one of the upper region and the lower region of the receiving space.

In one or more embodiments of this disclosure, the storage array module includes a back plane and a plurality of hard disks. The back plane is fixedly disposed on the second sliding tray, and electrically connected to the motherboard module and the power-supply module. The hard disks are stacked on the second sliding tray, and are pluggably connected to the back plane respectively.

In one or more embodiments of this disclosure, the server unit includes a wire protection chain. The wire protection chain extends to the upper region of the receiving space from the lower region thereof, and is connected to the motherboard module and the storage array module. The wire protection chain is consisted of a plurality of chain units which are joined each other in series, and each of the chain units has a hollow portion and all of the hollow portions are connected to each other to mutually form a wire passing channel.

In one or more embodiments of this disclosure, the storage array module comprises: at least one signal wire and at least one power wire. The signal wire is disposed in the wire passing channel, and electrically connected to the motherboard module and the back plane. The power wire is disposed in the wire passing channel, and electrically connected to the power-supply module and the back plane.

These and other features, aspects, and advantages of the present disclosure will become better understood with reference to the following description, accompanying drawings and appended claims.

It is to be understood that both the foregoing general description and the following detailed description are by examples, and are intended to provide further explanation of the disclosure as claimed.

BRIEF DESCRIPTION OF THE DRAWINGS

The present disclosure will be apparent to those skilled in the art by reading the following detailed description of a preferred embodiment thereof, with reference to the attached drawings, in which.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1:
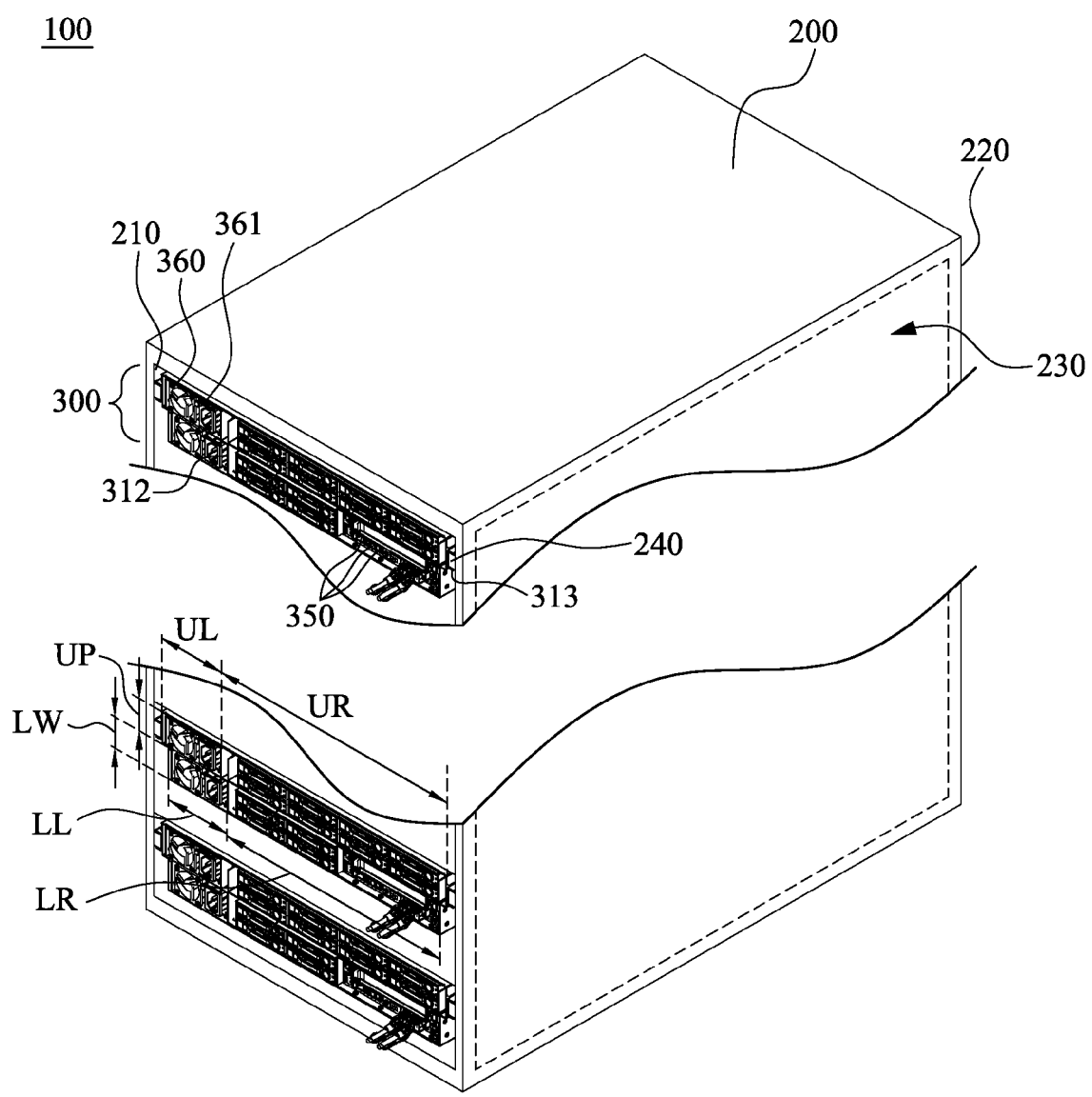
FIG. 1 is a partial front view of a server device according to one embodiment of the disclosure.

Reference is now made to FIG. 1. FIG. 1 is a partial front view of a server device 100 according to one embodiment of the disclosure. According to one embodiment of this disclosure, the server device 100 includes a server rack 200 and a plurality of server units 300. The server rack 200 is provided with a first opening 210 and a second opening 220 at two opposite ends of the server rack 200. The server rack 200 further includes an accommodation space 230 therein, and the accommodation space 230 is in communication with the first opening 210 and the second opening 220. The server units 300 are arranged in the accommodation space 230. Substantially, the server units 300 are stacked with each other in the accommodation space 230 by, for example, a single-row arrangement. However, the disclosure is not limited thereto, in one of other embodiments, the server rack can only be provided with a single server unit therein.

Figure 2:
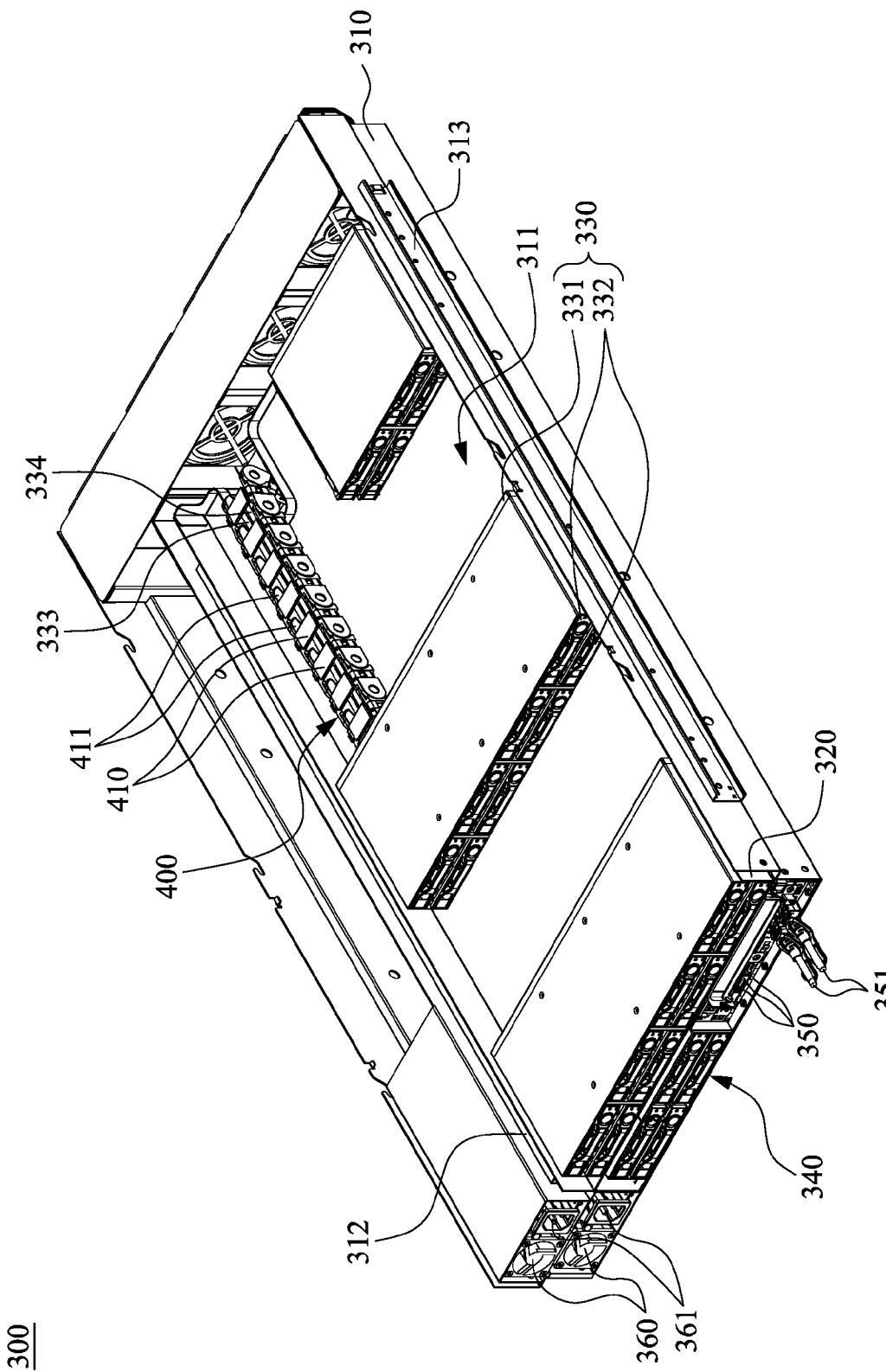
FIG. 2 is a perspective view of a server unit of FIG. 1.
Figure 3:
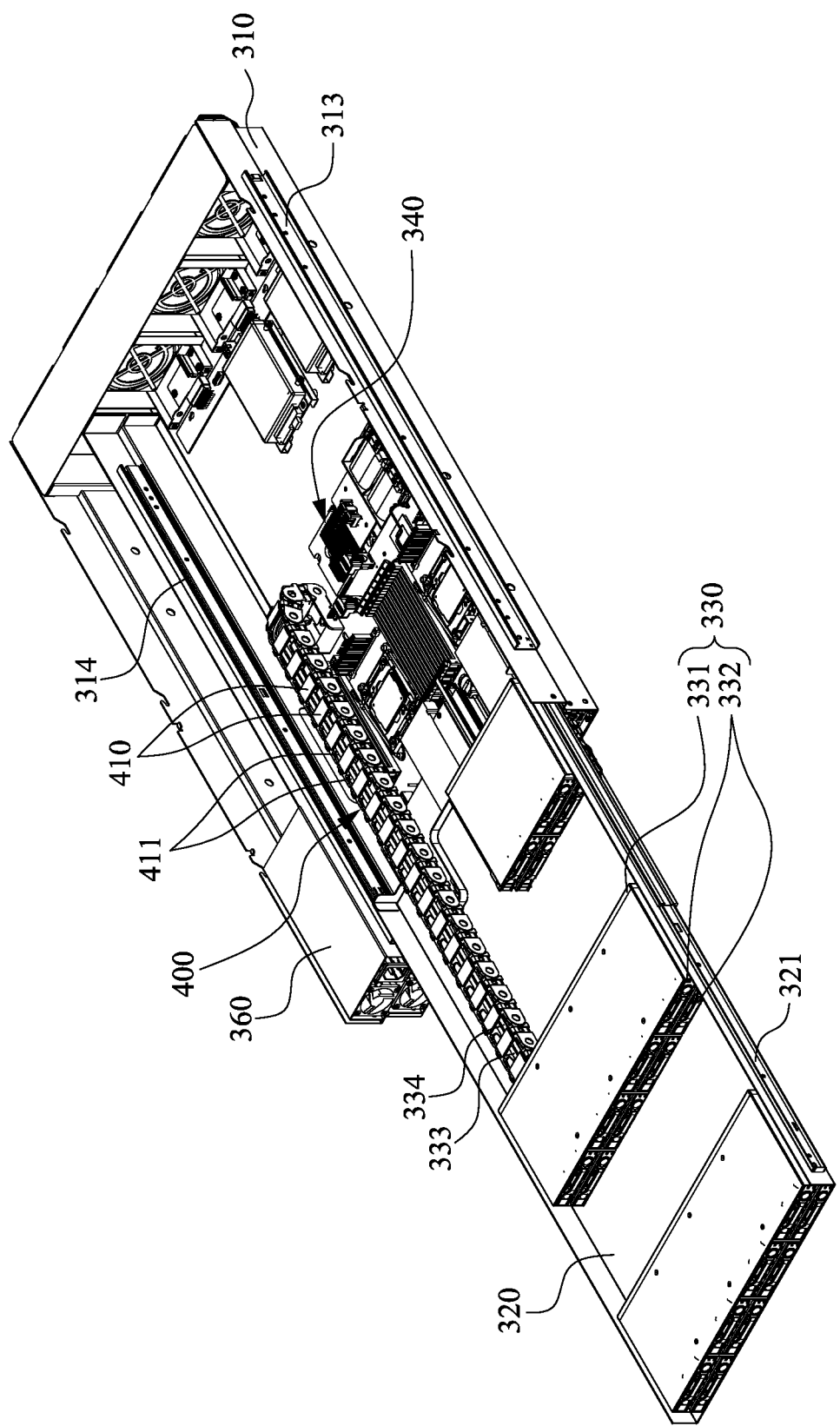
FIG. 3 is a schematic view of a second sliding tray of FIG. 2 being pulled out from the server unit.

Reference is now made to FIG. 2 and FIG. 3. FIG. 2 is a perspective view of a server unit 300 of FIG. 1, and FIG. 3 is a schematic view of a second sliding tray 320 of FIG. 2 being pulled out from the server unit 300. Each of the server units 300 includes a first sliding tray 310, a second sliding tray 320, at least one storage array module 330 and a motherboard module 340. The first sliding tray 310 is slidably disposed in the server rack 200 (See FIG. 1). The second sliding tray 320 is slidably disposed in the first sliding tray 310. The storage array module 330 is fixedly disposed on the second sliding tray 320. As shown in FIG. 3, the motherboard module 340 is disposed on the first sliding tray 310, not on the second sliding tray 320, and electrically connected to the storage array module 330.

Specifically, the first sliding tray 310 is slidably disposed in the accommodation space 230 of the server rack 200 (See FIG. 1), so that the first sliding tray 310 can be pushed into the accommodation space 230 or pulled outwards from the accommodation space 230 via the first opening 210. The first sliding tray 310 is provided with a receiving space 311 thereon. The second sliding tray 320 is slidably disposed in the receiving space 311, so that the second sliding tray 320 can be pushed into the receiving space 311 or pulled outwards from the receiving space 311 via the first opening 210.

Generally, in the server unit 300, since the frequency that the storage array module 330 needs to be maintained is normally greater than the frequency that the motherboard module 340 needs to be maintained, the storage array module 330 is arranged on the second sliding tray 320. Therefore, when the storage array module 330 in the server unit 300 is maintained or replaced with components, a supervisor only needs to pull the second sliding tray 320 out of the server rack 200 from the first sliding tray 310 for maintaining or replacing the storage array module 330. The supervisor does not have to entirely pull out the server unit 300 by pulling out the first sliding tray 310. Therefore, processing labor and time can be saved, and the convenience of the maintenance process of the server device 100 also can be enhanced.

In the embodiment, back to FIG. 1 again, the server rack 200 includes two main slide rails 240. The main slide rails 240 are respectively arranged on two opposite inner walls of the server rack 200. As shown in FIG. 2 and FIG. 3, the first sliding tray 310 includes two first rail parts 313 and two second rail parts 314. The first rail parts 313 are respectively arranged on two opposite outer walls of the first sliding tray 310. The first rail parts 313 of the first sliding tray 310 are respectively engaged with the main slide rails 240 of the server rack 200 (FIG. 1), so that the first sliding tray 310 can be pushed into or pulled outwards from the accommodation space 230 of the server rack 200 via the first opening 210. The second rail parts 314 are respectively arranged on two opposite inner walls of the first sliding tray 310. The second sliding tray 320 includes two third rail parts 321. The third rail parts 321 are respectively arranged on two opposite outer walls of the second sliding tray 320. The third rail parts 321 of the second sliding tray 320 are respectively engaged with the second rail parts 314 of the first sliding tray 310, so that the second sliding tray 320 can be independently pushed into or pulled outwards from the receiving space 311 of the first sliding tray 310 via the first opening 210, or the second sliding tray 320 can be collectively pushed into or pulled outwards from the accommodation space 230 of the server rack 200 along with the first sliding tray 310 via the first opening 210.

In the embodiment, as shown in FIG. 2, the server unit 300 includes a plurality of input/output interface elements 350. The input/output interface elements 350 are disposed on the motherboard module 340, and respectively electrically connected to the motherboard module 340. All of the input/output interface elements 350 are only disposed in the first opening 210 but the second opening 220 (FIG. 1), that is, no input/output interface element is on the second opening 220. For example, the input/output interface elements 350 may be exposed outside the server rack 200 from the first opening 210 or not exposed so that signal wires 351 which are plugged into a part or all of the input/output interface elements 350 may extend outside the server rack 200 from the first opening 210.

Furthermore, as shown in FIG. 2, the server unit 300 further includes at least one power-supply module 360. The power-supply module 360 is pluggably disposed in the receiving space 311, and electrically connected to the motherboard module 340 and the storage array module 330. Specifically, two power-supply modules 360 are stacked with each other in the receiving space 311. Each of the power-supply modules 360 includes a power port 361, and the power port 361 is located at the first opening 210, not on the second opening 220. For example, the power ports 361 may be exposed outside the server rack 200 from the first opening 210 or not exposed so that power lines (not shown) which are plugged into the power ports 361 may extend outside the server rack 200 from the first opening 210 (FIG. 1).

Thus, since the storage array module 330 can be moved outwards the server rack 200 from the first opening 210 along with the second sliding tray 320, and all of the input/output interface elements 350 and the power port 361 are only exposed from the first opening 210, therefore, before the server unit 300 is maintained or surveyed, the supervisor may proceed operating, replacing, plugging out one of the server unit 300, or removing the signal wires 351 being plugged into the input/output interface elements 350 and the power lines being plugged into the power port 361 from the near first opening 210. Because it is not necessary to moving to the rear end of the server rack 200, or to dismantle the server unit 300 in order to remove the wires, thus, the time of maintenance and inspection is saved.

Also, back to FIG. 1, in the embodiment, when the server device 100 is located in a machine room, a front end of the server rack 200 having the first opening 210 faces to a cold aisle of the machine room, and a rear end of the server rack 200 having the second opening 210 faces to a hot aisle of the machine room. Since none of the input/output interface elements and the power port are disposed on the rear end of the server rack 200, the supervisor may proceed operating, maintaining or replacing the server units on the cold aisle of the machine room only, does not need to do it on the hot aisle of the machine room so as to decrease the possible of the supervisor being jeopardized in health by overheat, and protect the supervisor.

In the embodiment, as shown in FIG. 2, a plurality of the storage array modules 330 are arranged on the second sliding tray 320 at intervals. Each of the storage array modules 330 includes a back plane 331 and a plurality of hard disks 332. The back plane 331 is fixedly disposed on the second sliding tray 320, and electrically connected to the motherboard module 340 and the power-supply module 360. The hard disks 332 are stacked on the second sliding tray 320, and pluggably connected to the back plane 331. In addition, the quantities of the hard disks 332 among the different storage array modules 330 can be different according to the current requirements and limitations.

As shown in FIG. 2 and FIG. 3, the storage array module 330 includes at least one signal wire 333 and at least one power wire 334. One end of the signal wire 333 is electrically connected to the back plane 331, and the other end of the signal wire 333 is electrically connected to the motherboard module 340. One end of the power wire 334 is electrically connected to the power-supply module 360, and the other end of the power wire 334 is electrically connected to the back plane 331 and the motherboard module 340.

In order to protect and trim the signal wire 333 and the power wire 334 for saving room and preventing from hindering the slide of the second sliding tray 320, the server unit 300 further includes a wire protection chain 400. The wire protection chain 400 connects to the motherboard module 340 and the storage array modules 330. The wire protection chain 400 is consisted of plural chain units 410 which are pivotally joined each other in series. Each of the chain units 410 has a hollow portion 411 therein, and all of the hollow portions 411 are connected together to entirely form a wire passing channel. The signal wire 333 and the power wire 334 are disposed in the wire passing channel, and are protected and guided by the wire protection chain 400.

Figure 4:
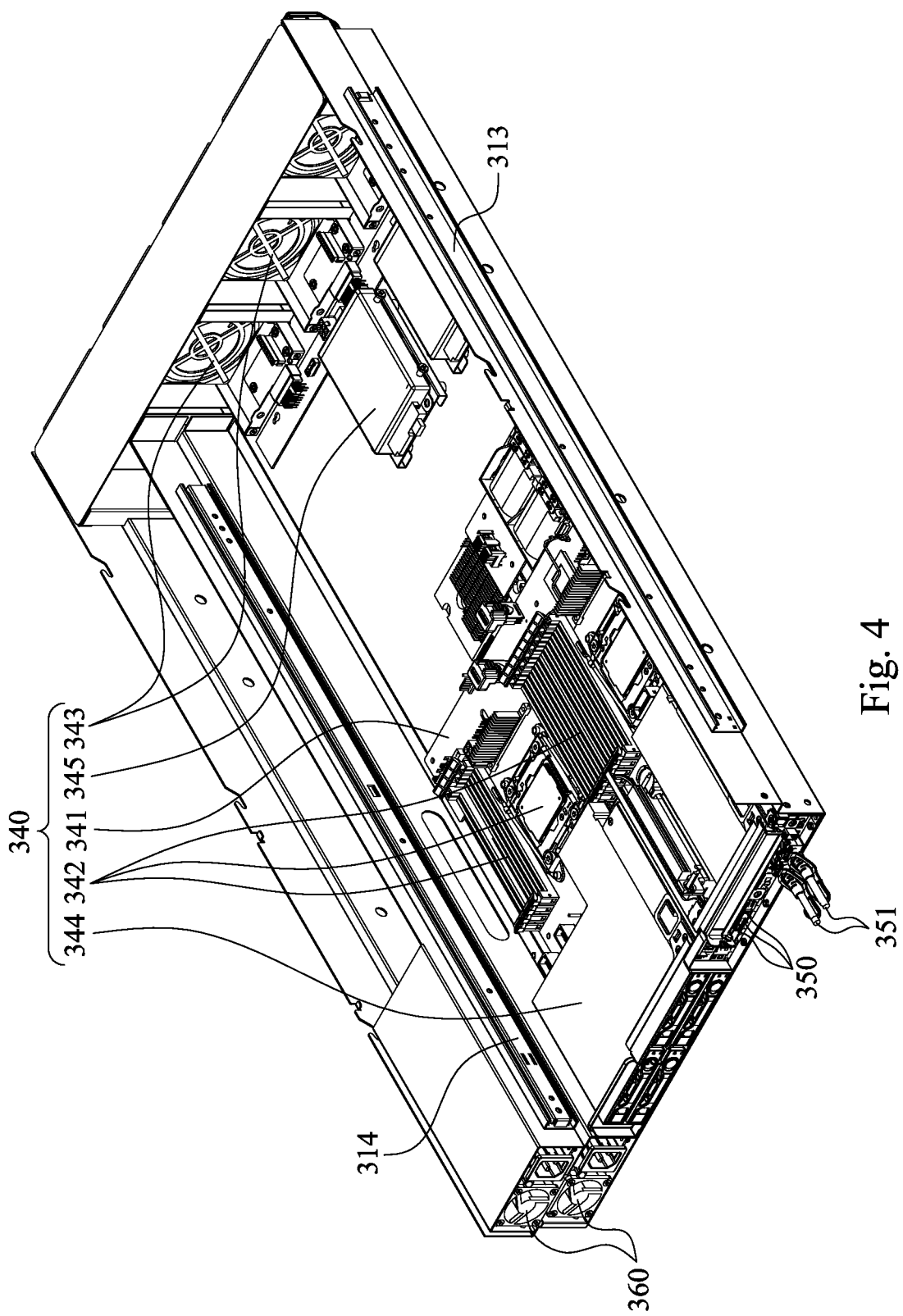
FIG. 4 is a schematic view of a second sliding tray being seen through from a server unit of FIG. 2.

Referring to FIG. 4, the motherboard module 340 includes a motherboard 341, plural electronic components 342 and plural fan modules 343. The electronic components 342 are disposed on the motherboard 341. For example, the electronic components 342 may be a Center Processing Unit (CPU), a Graphic Processing Unit (GPU), communication interface units, plural memory units and so on. The electronic components 342 are electrically connected to the motherboard 341. The input/output interface elements 350, for example, may be a display port, a network port or a USB port and so on. The input/output interface elements 350 are fixedly mounted on one end of the motherboard 341. The input/output interface elements 350 are electrically coupled to the motherboard 510, and are exposed outwards from one end of the first sliding tray 310. The fan modules 343 are arranged abreast on the first sliding tray 310 (FIG. 3), fully blocked the second opening 220, and electrically connected to the motherboard 341. Thus, when the first sliding tray 310 is completely disposed in the accommodation space 230, the fan modules 343 are exposed outwards from the second opening 220, or at least neighboring to the second opening 220 so that the fan modules 343 can accelerate airflows between the accommodation space 230 and the second opening 220. However, the fan modules 343 are not necessarily needed in the disclosure.

Moreover, the motherboard module 340 further includes a hard disk array 344 and at least one operation system storage 345 (e.g., hard disk device). The hard disk array 344 and the operation system storage 345 are oppositely arranged on two opposite ends of the first sliding tray 310, and electrically connected to the motherboard 341. Thus, when the first sliding tray 310 is completely disposed in the accommodation space 230, the hard disk array 344 is exposed outwards from the first opening 210, or at least neighboring to the first opening 210, and the operation system storage 345 is exposed outwards from the second opening 220, or at least neighboring to the second opening 220, so as to store much more information.

Furthermore, in order to provide more space for receiving more components so as to increase the performance of the server units 300, back to FIG. 1, the transversal surface of the first sliding tray 310 in the wide direction thereof is substantially in a U shape. The receiving space 311 is divided into an upper region UP and a lower region LW in a direction of the height (thickness) of the first sliding tray 310. The upper region UP and the lower region LW are stacked with each other. The first sliding tray 310 is further provided with a splitting plate 312 thereon, the splitting plate 312 stands on the first sliding tray 310 to divide into four containing spaces from the upper region UP and the lower region LW of the receiving space 311. In other words, four containing spaces are defined by the first sliding tray 310 and the splitting plate 312 to exist in both of the upper region UP and the lower region LW of the receiving space 311 with a "2×2" array arrangement. As shown in FIG. 1, the four containing spaces are respectively named for "upper-right sub-region UR", "upper-left sub-region UL", "lower-right sub-region LR", and "lower-left sub-region LL". Since the splitting plate 312 is in a Z-type, the upper-right sub-region UR and the lower-right sub-region LR are not completely aligned with each other, and the upper-left sub-region UL and the lower-left sub-region LL are not completely aligned with each other.

Since the upper-right sub-region UR, the upper-left sub-region UL, the lower-right sub-region LR, and the lower-left sub-region LL are provided in the receiving space 311, the motherboard module 340, the storage array module 330 and two of the power-supply modules 360 can be configured in the upper-right sub-region UR, the upper-left sub-region UL, the lower-right sub-region LR, and the lower-left sub-region LL at discretion of users.

However, in this disclosure, but not limited thereto, the second sliding tray 320 is slidably disposed in the upper-right sub-region UR of the receiving space 311, and the motherboard module 340 is received in the lower-right sub-region LR of the receiving space 311. The power-supply modules 360 are respectively received in the upper-left sub-region UL and the lower-left sub-region LL. The wire protection chain 400 extends to the upper region UP of the receiving space 311 from the lower region LW so as to connect to the motherboard module 340 located in the lower region LW and the storage array module 330 located in the upper region UP. However, this disclosure is not limited to the arrangement above.

When the first sliding tray 310 is out of the accommodation space 230 (See FIG. 1), the second sliding tray 320 still can be pulled out of the receiving space 311 to expose the motherboard module 340 located under the second sliding tray 320. Thus, a supervisor can proceed operating, replacing, plugging out or removing the electronic components 342 of the motherboard module 340 at the front end of the server unit 300, and does not need to proceed operating, replacing, plugging out or removing the electronic components 342 of the motherboard module 340 after dismantling the storage array modules 330 from the server unit 300 so as to increase the convenience of the maintenance process and decrease the time of the maintenance process.

To sum up, the server device allows users to only partially repair or replace specific components in the server device, and not have to completely pull out the first sliding tray every time. Thus, not only processing labor and time can be saved, but also the convenience of the maintenance process of the server device can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A server device, comprising:
    a server rack comprising an accommodation space, a first opening and a second opening, wherein the first opening and the second opening are located at two opposite ends of the server rack, and the accommodation space is in communication with the first opening and the second opening; and
    at least one server unit comprising:
        a first sliding tray slidably disposed in the accommodation space, for being pushed into and pulled outwards from the accommodation space via the first opening, and the first sliding tray is provided with a receiving space thereon, wherein the first sliding tray is divided into a first, second, third, and fourth region in a 2×2 arrangement, the first and second regions being stacked vertically, the third and fourth regions being stacked vertically;
        a second sliding tray slidably disposed in the first region of the first sliding tray, for being pushed into and pulled outwards from the first sliding tray via the first opening;
        a storage array module fixedly disposed on the second sliding tray;
        a motherboard module fixedly disposed in the second region of the first sliding tray, and electrically connected to the storage array module;
        a wire protection chain extending from the first to the second region of the first sliding tray, connected to the motherboard module and the storage array module, wherein the wire protection chain is consisted of a plurality of chain units which are joined each other in series, and each of the chain units has a hollow portion and all of the hollow portions are connected to each other to mutually form a wire passing channel;
        a first power-supply module pluggably disposed in the third region of the first sliding tray, and electrically connected to the motherboard module and the second sliding tray; and
        a second power-supply module pluggably disposed in the fourth region of the first sliding tray, and electrically connected to the motherboard module and the second sliding tray.

2. The server device according to claim 1, wherein the server unit comprises:
    a plurality of input/output interface elements disposed on the motherboard module, and electrically connected to the motherboard module, wherein, all of the input/output interface elements are only exposed outwards from the first opening.

3. The server device according to claim 1, wherein the receiving space is divided into an upper region and a lower region which are stacked upon each other.

4. The server device according to claim 3, wherein the second sliding tray is slidably disposed in one of the containing spaces of the upper region of the receiving space.

5. The server device according to claim 3, wherein the second sliding tray comprises:
    a back plane fixedly disposed on the second sliding tray, and electrically connected to the motherboard module and the power-supply module;
    and a plurality of hard disks stacked on the second sliding tray, pluggably connected to the back plane.

6. The server device according to claim 1, wherein the wire passing channel comprises:
    at least one signal wire electrically connected to the motherboard module and the back plane; and
    at least one power wire electrically connected to the power-supply module and the back plane.

7. The server device according to claim 1, wherein the second sliding tray and the motherboard module are configured to operate as a single compute module.

* * * * *